US008225173B2

(12) United States Patent
Shasha

(10) Patent No.: US 8,225,173 B2
(45) Date of Patent: Jul. 17, 2012

(54) MULTI-RATE LDPC CODE SYSTEM AND METHOD

(75) Inventor: Eli Shasha, Holon (IL)

(73) Assignee: Runcom Technologies Ltd, Holon (IL)

( * ) Notice: Subject to any disclaimer, the term of this patent is extended or adjusted under 35 U.S.C. 154(b) by 931 days.

(21) Appl. No.: 12/281,279

(22) PCT Filed: Jun. 24, 2005

(86) PCT No.: PCT/IL2005/000679
§ 371 (c)(1),
(2), (4) Date: Aug. 29, 2008

(87) PCT Pub. No.: WO2006/001015
PCT Pub. Date: Jan. 5, 2006

(65) Prior Publication Data
US 2009/0228771 A1    Sep. 10, 2009

Related U.S. Application Data

(60) Provisional application No. 60/582,583, filed on Jun. 25, 2004, provisional application No. 60/601,956, filed on Aug. 17, 2004.

(51) Int. Cl.
*H03M 13/00* (2006.01)
(52) U.S. Cl. ........ 714/758; 714/746; 714/751; 714/752; 714/764; 714/790; 714/792; 714/799; 714/801; 714/800

(58) Field of Classification Search .................. None
See application file for complete search history.

(56) References Cited

U.S. PATENT DOCUMENTS

| | | | | |
|---|---|---|---|---|
| 7,178,082 | B2* | 2/2007 | Yu et al. | 714/752 |
| 7,831,883 | B2* | 11/2010 | Tong et al. | 714/752 |
| 2005/0278604 | A1* | 12/2005 | Yokokawa et al. | 714/758 |
| 2005/0283707 | A1* | 12/2005 | Sharon et al. | 714/758 |
| 2006/0053359 | A1* | 3/2006 | Chae et al. | 714/752 |
| 2007/0011568 | A1* | 1/2007 | Hocevar | 714/758 |
| 2011/0055655 | A1* | 3/2011 | Hocevar | 714/752 |

* cited by examiner

*Primary Examiner* — John Trimmings
(74) *Attorney, Agent, or Firm* — Smith Risley Tempel Santos LLC; Gregory S. Smith

(57) ABSTRACT

A method for creating cyclic permutation matrices P (810), with an arbitrary size Z×Z set by a parameter Z5 and which are used to create one or more LDPC related matrices in OFDMA systems, comprising: defining an integer value Z; creating an initial matrix (810); creating a matrix (810) by using cyclic shifts to each row; repeating stage 3, up to Z−2 times as required, thus creating up to Z−2 matrices: P(o) ... P(Z−I); creating an additional stairs matrix P(st). A method for using cyclic per-mutation matrixes P (840), with a fixed size Z×Z set by a parameter Z, and which are used to create one or more LDPC related matrices (820) in OFDMA systems, comprising: defining an integer value Z; storing in memory means an initial matrix (810) and its cyclic shifts permutations (840), thus keeping memory means matrices: P(o) ... P(Z−I); storing an additional stairs matrix P(st) (840); using these matrices (810) to create LDPC related matrices (840) or LDPC operations.

9 Claims, 8 Drawing Sheets $$700 \quad H_b = \begin{bmatrix} 0 & 0 & P^{20} & P^{20} & P^2 & P^{22} & P^{23} & P^8 & P^{20} & 0 & 0 & 0 & 0 & 0 & 0 \\ 0 & 0 & 0 & 0 & P^{21} & P^7 & P^{22} & P^{20} & P^{13} & P^{13} & 0 & 0 & 0 & 0 & 0 \\ 0 & 0 & 0 & 0 & 0 & P^{21} & P^{10} & P^{21} & P^{11} & P^{18} & P^9 & 0 & 0 & 0 & 0 \\ 0 & 0 & 0 & 0 & 0 & 0 & P^{14} & P^9 & P^{10} & P^{20} & P^7 & P^4 & 0 & 0 & 0 \\ P^0 & P^{21} & 0 & 0 & 0 & 0 & 0 & 0 & 0 & P^{12} & P^9 & P^{10} & P^{12} & 0 & 0 \\ P^5 & P^{17} & P^9 & P^6 & 0 & 0 & 0 & 0 & 0 & 0 & 0 & P^{13} & P^4 & P^3 & 0 & 0 \\ 0 & P^1 & P^1 & P^{12} & P^{10} & 0 & 0 & 0 & 0 & 0 & 0 & 0 & P^{22} & P^3 & P^{13} & 0 \\ 0 & 0 & 0 & P^{15} & P^{23} & P^{18} & 0 & 0 & 0 & 0 & 0 & 0 & 0 & P^{22} & P^7 & P^{st} \end{bmatrix}$$

(columns labeled H1: 1 2 3 4 5 6 7, H2: 1 2 3 4 5 6 7 1 2)

$$P^{st} = \begin{bmatrix} 1 & & & & & \\ 1 & 1 & & & 0 & \\ & 1 & \ddots & & & \\ & & \ddots & & 1 & \\ 0 & & & & 1 & 1 \end{bmatrix}$$

500

$Z \times Z$ $$P^0 = \begin{bmatrix} 1 & & & & \\ & 1 & & 0 & \\ & & \ddots & & \\ & 0 & & 1 & \\ & & & & 1 \end{bmatrix}$$

510

$$P^1 = \begin{bmatrix} 0 & 1 & 0 & \cdots & 0 \\ 0 & 0 & 1 & \ddots & \vdots \\ \vdots & \vdots & \ddots & \ddots & 0 \\ 0 & 0 & \cdots & 0 & 1 \\ 1 & 0 & \cdots & 0 & 0 \end{bmatrix}$$

520

$$P^2 = \begin{bmatrix} 0 & 0 & 1 & 0 & \\ \vdots & 0 & 0 & \ddots & 0 \\ 0 & \vdots & \ddots & \ddots & 1 \\ 1 & 0 & \cdots & 0 & 0 \\ 0 & 1 & 0 & \cdots & 0 \end{bmatrix}$$

530

$$P^{Z-1} = \begin{bmatrix} 0 & 0 & \cdots & 0 & 1 \\ 1 & 0 & \cdots & & 0 \\ 0 & 1 & \ddots & & \vdots \\ \vdots & \ddots & \ddots & 0 & 0 \\ 0 & \cdots & 0 & 1 & 0 \end{bmatrix}$$

$$P^i = \begin{bmatrix} 0 & \cdots & 0 & 1 & 0 & \cdots & 0 \\ \vdots & \ddots & \ddots & & 1 & \ddots & \vdots \\ 0 & \ddots & \ddots & & & \ddots & 0 \\ 0 & 1 & 0 & \cdots & & & 0 \\ 0 & \cdots & & & 0 & 1 & 0 \\ \vdots & \ddots & & & \ddots & \ddots & \vdots \\ 0 & \cdots & 0 & 1 & 0 & \cdots & 0 \end{bmatrix} \begin{matrix} \\ \\ \\ \updownarrow Z \\ \\ \\ \end{matrix}$$

$\longleftrightarrow Z \longleftrightarrow$

$$H_b = \left[\begin{array}{cccccccc}
1 \rightarrow & 0 & 0 & 0 & P^0 & P^5 & 0 & 0 \\
2 \rightarrow & 0 & 0 & 0 & 0 & P^{21} & P^{17} & P^1 & 0 \\
3 \rightarrow & P^{20} & 0 & 0 & 0 & 0 & P^9 & P^1 & 0 \\
4 \rightarrow & P^{20} & 0 & 0 & 0 & 0 & P^6 & P^{12} & P^{15} \\
5 \rightarrow & P^2 & P^{21} & 0 & 0 & 0 & 0 & P^{10} & P^{23} \\
6 \rightarrow & P^{22} & P^7 & P^{21} & 0 & 0 & 0 & 0 & P^{18} \\
7 \rightarrow & P^{23} & P^{22} & P^{10} & P^{14} & 0 & 0 & 0 & 0 \\
1 \rightarrow & P^8 & P^{20} & P^{21} & P^9 & 0 & 0 & 0 & 0 \\
\hline
2 \rightarrow & P^{20} & P^{13} & P^{11} & P^{10} & 0 & 0 & 0 & 0 \\
3 \rightarrow & 0 & P^{13} & P^{18} & P^{20} & P^{12} & 0 & 0 & 0 \\
4 \rightarrow & 0 & 0 & P^9 & P^7 & P^9 & 0 & 0 & 0 \\
5 \rightarrow & 0 & 0 & 0 & P^4 & P^{10} & P^{13} & 0 & 0 \\
6 \rightarrow & 0 & 0 & 0 & 0 & P^{12} & P^4 & P^{22} & 0 \\
7 \rightarrow & 0 & 0 & 0 & 0 & 0 & P^3 & P^3 & P^{22} \\
1 \rightarrow & 0 & 0 & 0 & 0 & 0 & 0 & P^{13} & P^7 \\
2 \rightarrow & 0 & 0 & 0 & 0 & 0 & 0 & 0 & P^{st}
\end{array}\right] \begin{matrix} \\ \\ H1 \\ \\ \\ \\ \\ \\ \\ H2 \\ \\ \\ \\ \\ \end{matrix}$$

MULTI-RATE LDPC CODE SYSTEM AND METHOD

This application is filed under 35 USC 371 and is based on, and claims the benefit of, International Application having a serial number of PCT/IL2005/000679, which was filed on Jun. 24, 2005 and claiming priority to U.S. Provisional Application for Patent filed on Jun. 25, 2004 with a title of MULTI-RATE LDPC CODE FOR OFDMA PHY and assigned Ser. No. 60/582,583 and U.S. Provisional Application for Patent filed on Aug. 17, 2004 with a title of MULTI-RATE LDPC CODE FOR OFDMA PHY and assigned Ser. No. 60/601,956, all of which are incorporated herein by reference.

TECHNICAL FIELD

This invention relates to LDPC codes, and more specifically to such codes using new LDPC approaches with unique characteristics.

BACKGROUND ART

The Low Density Parity Check Code (LDPC) are known in the art for various applications. LDPC is an advanced error correcting linear code, which is used in encoding and decoding in order to detect and correct errors.

LDPC can achieve similar or better performance than those of turbo codes, with lower decoder complexity.

Soft input soft output decoder and iterative decoding of the received data block approaches can be used in LDPC.

LDPC can be implemented without using an interleaver.

Code rate can be changed in a relatively simple approach while using LDPC.

The matrices, which represent block size and/or code rate, are easy to design, and can be optimized to specific requirements.

Encoding is implemented by combining parity check bits and a data vector, thus creating a unique codeword vector. Upon receiving the codeword vector, it is possible to detect and correct a number of errors.

LDPC can be implemented in OFDMA systems in the encoding and decoding means, for better performance with an easier implementation.

In particular, LDPC can be used in OFDMA systems according to the 802.16 standard.

A codeword vector c, having a size of 1×n, can be found by multiplying the input data vector v, of the size of 1×k, with a Generator matrix G, which is k×n, as follows:

$$c = v*G$$

The codeword, the input data and the Generator matrix's symbols, all belong to a finite Galois Field, preferably they are over the binary field. According to this invention all the symbols are over the binary field GF(2), it is possible though to group several bits and to represent smaller vectors and matrices under other finite Galois Fields as well.

The block Parity Check Matrix, H, is known as the matrix which is orthogonal to the codeword created by G, hence for every valid codeword: $c*H'=0$, where H' is the transposed matrix of H:

$H'(a,b)=H(b,a)$. The size of H is (n−k)×n.

In LDPC, it is possible to derive the codeword c directly from H, without calculating G. It is possible to perform various manipulations in the H matrix, in order to adapt it to the characteristics of required encoding parameters.

Creating H is not trivial and there may be several solutions for the internal initial values of the (n−k)×n components in the H matrix.

LDPC can achieve similar or better performance than those of turbo codes, with lower decoder complexity.

Soft input soft output decoder and iterative decoding of the received data block approaches can be used in LDPC, and it can be implemented without using interleaver.

DISCLOSURE OF INVENTION

This invention describes a construction of a structured Multi-Rate Low-Density Parity-Check (MR-LDPC) code for OFDMA PHY. A basic mother code is used for deriving various code rates by merging parity checks of the mother code. The mother code is constructed using a block parity-check matrix with cyclic permutation blocks.

All codes derived from the mother code can be implemented on the same hardware of the mother code without additional cost.

Since the basic code is structured, the implementation complexity is low. The codes' parity check matrices have a lower triangular parity-bits section, enabling efficient linear encoding. The new invention includes flexible matrix's support rates, from ½ to ¾, for both large and small block size.

This design of the matrices improves the performance of both small and long blocks relative to rigid matrices, such as those proposed by Motorola and Intel, while using less hardware resources.

According to current invention, it is possible to achieve linear decoding time with block length for better utilization of hardware resources. The matrices are designed to converge in a small number of iteration to reduce latency and hardware complexity. These properties are important for minimization of power consumption.

Matrices structure is designed to accommodate the 802.16 OFDMA sub-channel structures of 48 carriers and multiples.

According to current invention, code rate can be changed in a relatively simple approach while using LDPC.

The matrices which represent block size and/or code rate are easy to design, and can be optimized to specific requirements.

The novel solution comprises several improvements, thus a new error correcting system and method can be implemented, preferably with the OFDMA 802.16 standard.

The new system and method is expected to be less complex and may consume less hardware resources than those needed while using turbo codes alternative.

The new approach may present better performance than turbo code, such as when it is used with large data block sizes or high data rate. This new invention gives efficient implementation, which can support many block sizes and code rates.

According to this invention it is possible to create an H matrix of any dimensions, thus it is possible to set the required n, k easily.

The novel design of the components in this invention offers these benefits:

1. Adjacent rows are similar—this is helpful in the implementation of the encoder and decoder for the code.
2. It is possible to increase the code rate R by uniting a number of rows. The rows to be united are selected using a novel method, so that code performance remains good. The row combining method is proposed to support multi rate with minimal additional complexity. The scheduling of rows is designed to support the implementation pipeline to enable fast convergence.
3. H is designed in such a way as to offer good performance with a unique design, this refers to the content and allocation of the z×z matrices in H.
4. The internal matrices are designed in a novel manner which offers many benefits.
5. The novel sizes and dimensions chosen for the internal matrices and H, offer various benefits, such as the ability to use all of the available resources in standard 802.16.

BRIEF DESCRIPTION OF DRAWINGS

FIG. 5 illustrates several cyclic permutation matrices P

FIG. 6 illustrates an arbitrary cyclic permutation matrix P(i)

FIG. 7 illustrates construction of block matrix Hb using permutation matrices P

MODES FOR CARRYING OUT THE INVENTION

Figure 1:
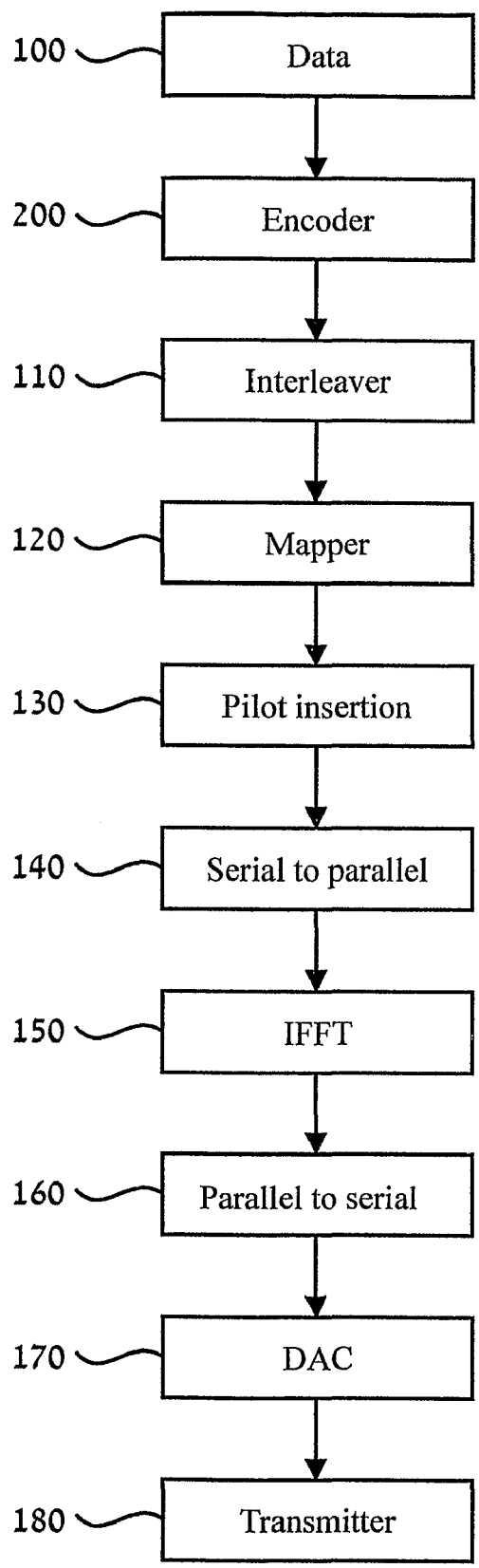
FIG. 1 illustrates general block diagram of OFDM data transmission system.

FIG. 1 illustrates general block diagram of OFDM data transmission system.

Figure 2:
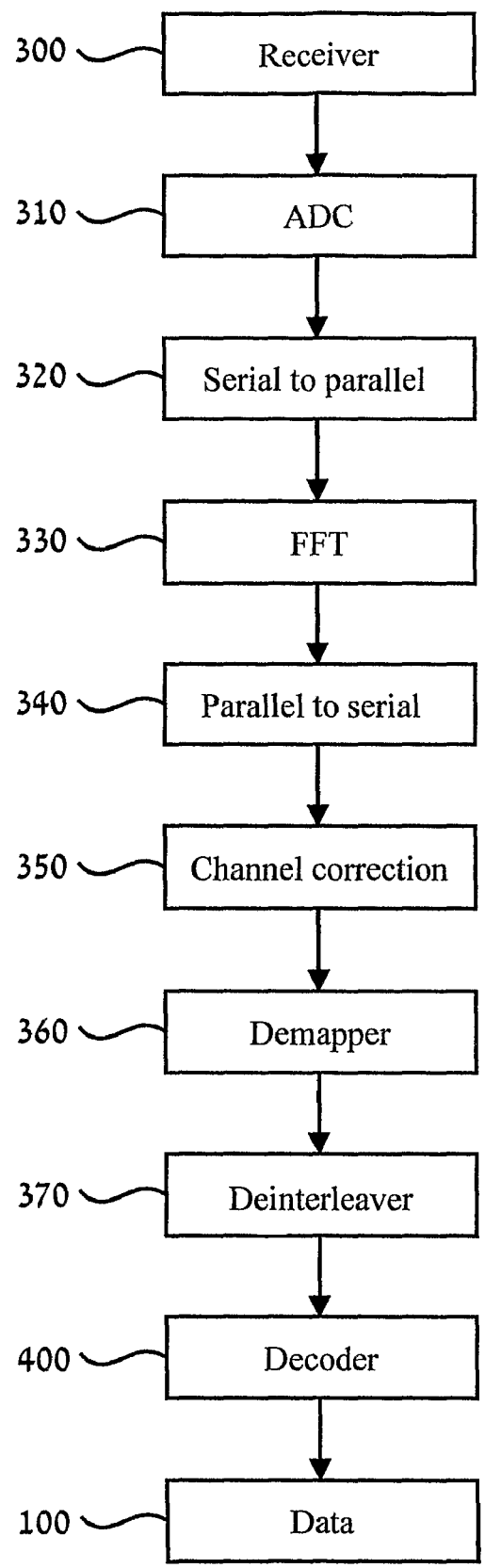
FIG. 2 illustrates general block diagram of OFDM data reception system.

FIG. 2 illustrates general block diagram of OFDM data reception system.

The benefits described in this invention may be implemented in one embodiment at the encoder 200 and/or decoder 400. According to one embodiment there is no need to use interleaver or deinterleaver means 110, 370 respectively in such a system.

Figure 3:
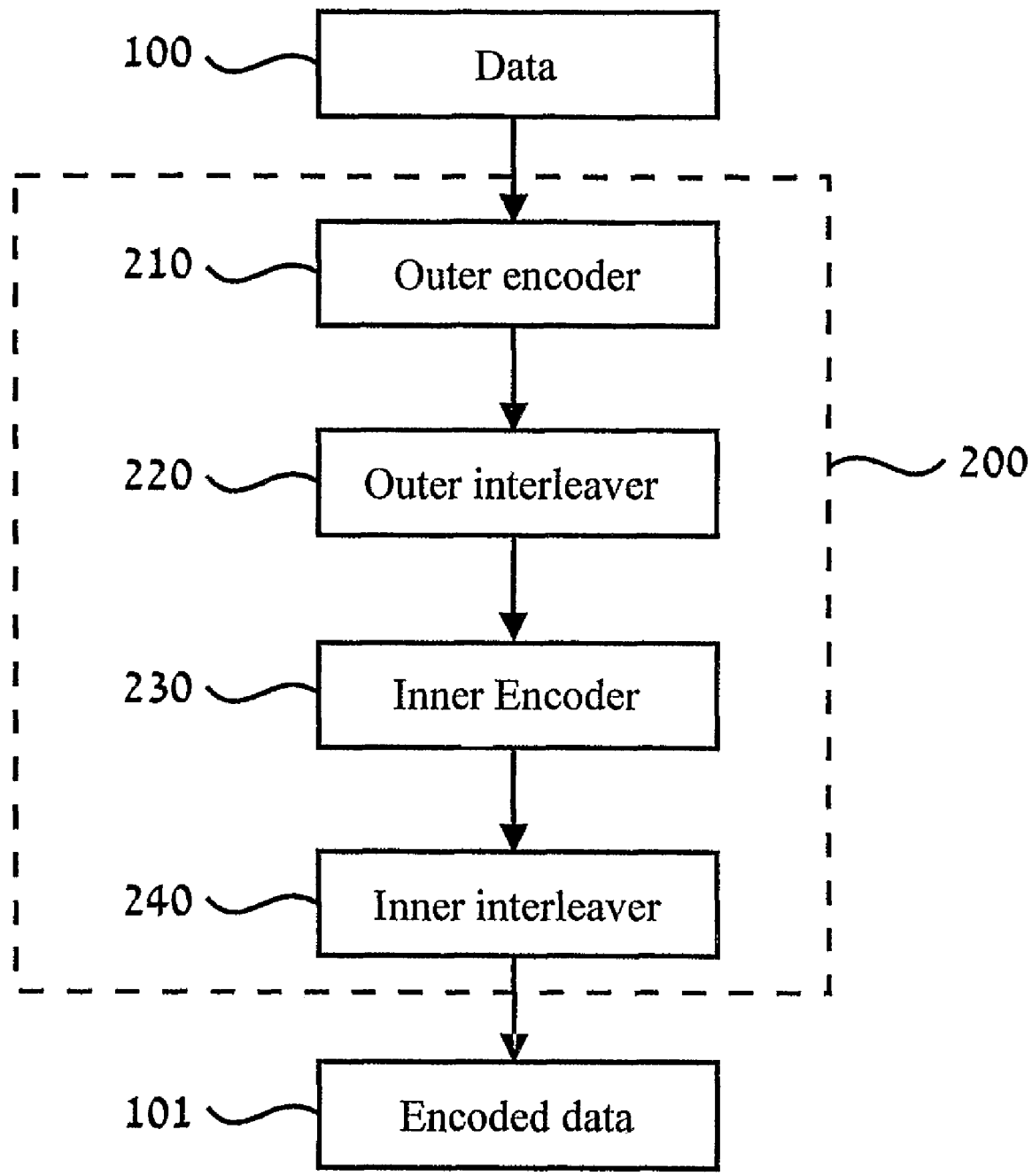
FIG. 3 illustrates general block diagram of data encoding in OFDM.

FIG. 3 illustrates general block diagram of data encoding in OFDM.

Figure 4:
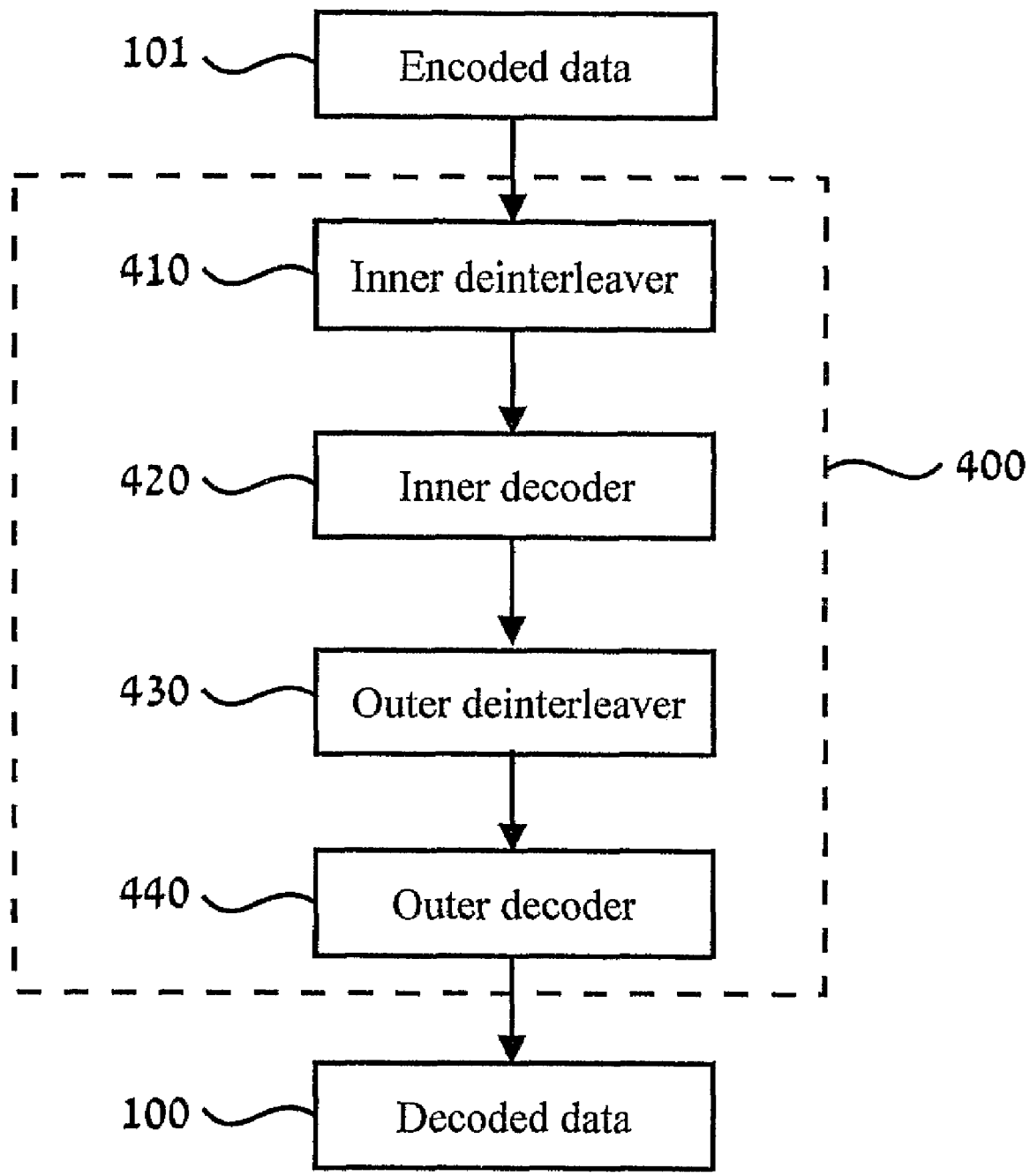
FIG. 4 illustrates general block diagram of data decoding in OFDM.

FIG. 4 illustrates general block diagram of data decoding in OFDM.

This invention may be implemented in any of these blocks, and especially in inner encoder/decoder means 230, 420 respectively. Interleaver and deinterleaver means are optional with respect to this invention.

This invention may be implemented in outer encoder/decoder means 210, 440 respectively. Outer encoding means are optional as well with respect to this invention.

The systems and methods described hereinafter may be used according in OFDMA systems, and especially with such systems which are designed according to the 802.16 standard. According to the new invention, the H matrix can be divided into two matrices:

$$H = [H1 | H2]$$

The codeword can be divided into two vectors:

$$c = [v | \text{Parity}]$$

where v is the input data vector (1×k), and Parity is the parity check vector, which is in the size of 1×(n−k).

From the previous definition that c*H'=0, an equivalent formula is:

$$H*c' = 0$$

which can be written as:

$$[H1 | H2]*[v|\text{parity}]' = 0.$$

From the last equation we derive:

$$H1*v = H2*\text{parity}$$

and:

$$\text{parity} = (inv(H2)*H1)*v$$

inv(H2) is the inverse matrix of H2. The inverse matrix of H2 can be easily found as H2 is set to be a lower triangular matrix.

The dimensions of H1 are (n−k)×k, and of H2 are: (n−k)×(n−k). Thus, the codeword c can be easily constructed:

$$c = [v | \text{Parity}]$$

A rate for the code, R is defined as the ratio between the length of the input data vector and the codeword vector c, thus: R=k/n.

Since k is the length of v, and n is the length of c, the rate R can be set by setting the dimensions of H:

The height of H is: n−k

The width of H is: n

One of the benefits of this invention is using such a matrix H which allows to unite (collate) two rows or more into one new row, by adding the rows.

As a result of uniting rows, the height of the H matrix is reduced, thus n remains the same but k is increased since there will be less rows.

By using this method, it is possible to use a shorter input data vector, with more parity check symbols.

Using this approach it is possible to easily change code rate R.

This approach can be implemented using less hardware resources, even though the code characteristics may be changed.

H is such that each of its internal components is a squared matrix with the dimensions z×z. The special parameter z can be changed in order to determine the size of these internal matrices, which are also referred as: "small z×z blocks".

According to this paper, a basic block matrix Hb, is used from which a parity check matrix of mother code H or Hm can be created, using existing or novel systems and methods.

The internal squared matrices are marked as: 0, P(0) ... P(z−1), P(st) 0 is the zero matrix.

P(st) is a stairs matrix.

P(0) is the identity matrix.

P(i), 0<i<z, is p(0) after i cyclic movements to the right of the components in each row. A component which is shifted from the end of the line, is shifted to the leftmost location in that line.

By changing the z parameter, it is possible to change the size of H1, H2 and H altogether. Thus, the size of the codeword: n, the size of information vector: k, and the number of parity check symbols: n−k, can be easily increased by increasing z.

In one embodiment, the mother code is a length $N_m$ rate ½ systematic structured LDPC code. The parity-check matrix of the mother code $H_m$ is constructed using a $$\frac{N_m}{2Z} \times \frac{N_m}{Z}$$

block matrix $H_b$ or Hb, consisting of small Z×Z blocks, which are either the zero matrices or a cyclic permutation matrix. For brevity of notation we denote the dimensions of the block matrix by $$M_b = \frac{N_m}{2Z}$$

and $$N_b = \frac{N_m}{Z}.$$

FIG. 5 illustrates several cyclic permutation matrices P, it can be seen that the Z matrices P(0) to P(Z−1) can be created using cyclic shifts, as indicated by the arrow above P(1). P(st) can be created by adding matrices P(0) and P(Z−1).

FIG. 6 illustrates an arbitrary cyclic permutation matrix P(i), in order to create matrices P(0) to P(Z−1), the following method can be used.

The method for building permutation matrices P(i), may include:
1. Define an integer value Z.
2. Create an initial matrix, preferably $P^0$, which is the identity matrix.
3. By using one cyclic shift right, to each row, it is possible to create P(1), the one and zeros in rightmost locations are shifted to the leftmost cell in that line.
4. This operation is repeated Z−2 times, creating P(0) . . . to P(Z−1).
5. An additional stairs matrix P(st), is created as well.

According to this method, Z permutation matrices in the size of Z×Z are created, for the purpose of later using them to construct H, Hb, Hm or any other LDPC and/or Parity check related matrix.

Z is an integer parameter, which can be initially defined according to matrix size, hardware and performance considerations.

In two preferred embodiments Z is either 12 or 24, which is useful for OFDMA, however other values can be defined as well.

P(st) the stairs matrix can be created in any stage, or in other methods such as by summing existing matrices: P(st)=P(0)+P(Z−1)

The initial matrix may be P(0) or any other matrix. Cyclic shifts may be performed to the left, Creating P(Z−1), P(Z−2) . . . or to the right.

It is possible to store P matrices in any type of digital memory or storage means, and to read them from that source. According to this method it is easy to create P matrices of any Z×Z size easily.

FIG. 7 illustrates construction of block matrix Hb using permutation matrices P

This matrix is created using Z×Z matrices including the zero matrix 0. The overall size of this matrix is $(N_m/2) \times N_m$ since the height is: $n-k=N_m/2$ and the width is $n=N_m$ then the initial code rate is R=(n−k)/n=0.5

This matrix, also referred as "block matrix", Hb or Hb includes $$\frac{N_m}{2Z} \times \frac{N_m}{Z}$$

matrices, consisting of small Z×Z blocks, which may include one or more of: the zero matrix, P(st) and P(i).

The dimensions of the block matrix is $$M_b = \frac{N_m}{2Z}$$

rows of and $$N_b = \frac{N_m}{Z}.$$

columns of Z×Z matrices.

As shown in the figure, the $N_b$ block columns of the block parity-check matrix are divided to sets $S_1, S_2, \ldots, S_7$ by numbering them as follows: 1 2 3 4 5 6 7 1 2 3 4 5 6 7 1 2 3 4 5 6 7 . . . According to the embodiment shown in this figure, $N_b$=16 and the matrices columns are numbered: 1 2 3 4 5 6 7 1 2 3 4 5 6 7 1 2.

Figure 8:
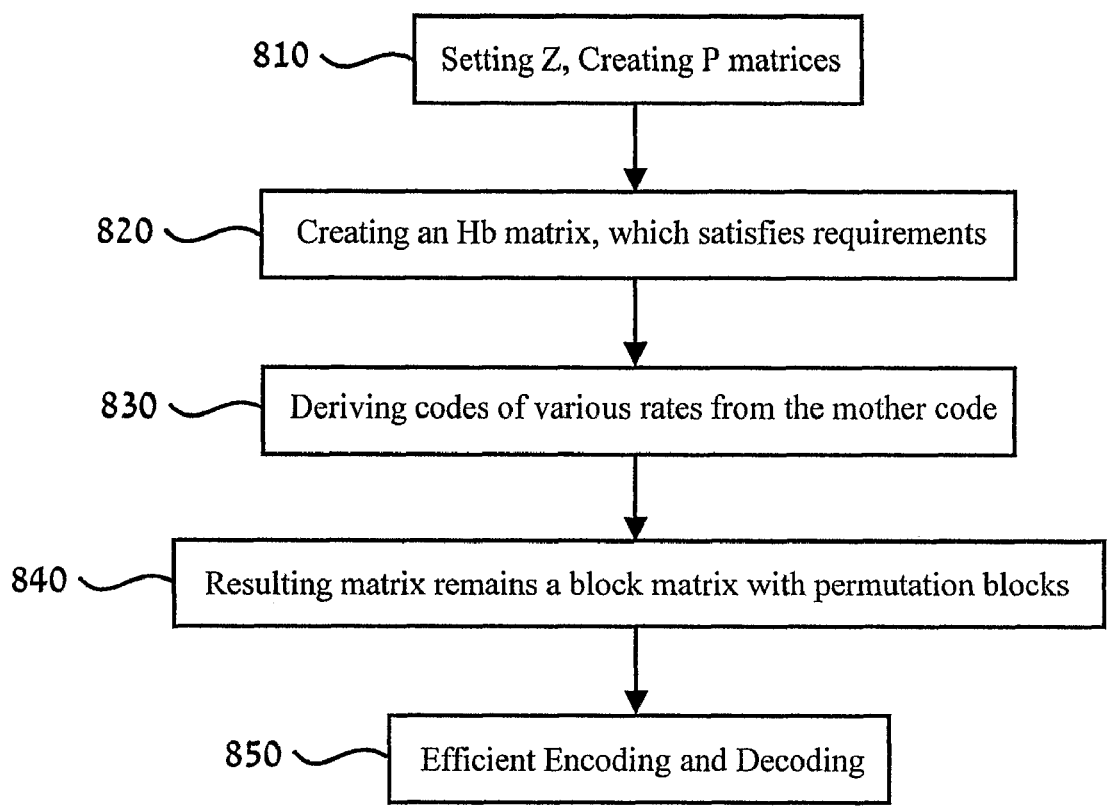
FIG. 8 illustrates a method for creating a parity check matrix

FIG. 8 illustrates a method for creating a parity check matrix, the method for creating a parity check matrix comprises:

A. Creating the Hb matrix 820, which should satisfy the following requirements:
1. The $M_b \times M_b$ right side of the matrix is lower triangular.
2. The lower rightmost block of the matrix is $P^{st}$.
3. Each row in the block matrix contains 6 or 7 non-zero block entries belonging to different sets of columns, i.e. a row cannot contain more than one block entry from any set $S_j$, $j \in \{1, \ldots, 7\}$.
4. $H_b$ is an irregular matrix, such that the block columns weights spectrum is optimized for providing good code performance in a small number of decoding iterations. (a block column's weight is the number of non-zero block entries in a column).
5. Rows j and $$j + \frac{M_b}{2}$$

for $$j = 1, \ldots, \frac{M_b}{2}$$

have no overlapping non-zero block entries.
6. $H_{m/2}$ denote the resulting parity-check matrix that is obtained by summing up the lower and upper $$\frac{M_b}{2} \times N_b$$

parts the block matrix $H_b$. Then, the resulting parity check matrices $H_m$ and $H_{m/2}$ do not contain short cycles.

FIG. 7 illustrates one embodiment of constructing the block matrix Hb using permutation matrices P. According to one embodiment, with reference to this figure, $N_m$=384, Z=24 and there are 8×16 permutation matrices in Hb.

B. Deriving codes of various rates from the mother code 830

Codes of various rates between ½ and ¾ can be derived from the mother code by summing up pairs of rows of the block matrix $H_b$, in this way creating the H or Hm matrix.

A code of rate $$\frac{1}{2} + \frac{\alpha}{N_b}$$

for any $$\alpha \in \left\{0, \ldots, \frac{N_b}{4}\right\}$$

can be obtained by summing up the rows j and $$j + \frac{M_b}{2}$$

for $j=1, \ldots, \alpha$. The resulting block matrix after summation is a $(M_b-\alpha) \times N_b$, hence the code rate is $$1 - \frac{M_b - \alpha}{N_b} = \frac{1}{2} + \frac{\alpha}{N_b}.$$

Because of requirement A.5 of the constructed mother code, the resulting matrix after summation remains a block matrix with permutation blocks as its entries. All derived codes are of length $N_m$. All derived codes have the same number of 1's in their parity-check matrix because of requirement A.5.

According to another embodiment, when using one or more of the abovementioned methods, encoding can be made more efficiently.

All the constructed codes have a lower triangular block parity-check matrix; hence they have a very simple linear encoding based on Gaussian elimination.

Encoding can be performed using the decoder by initializing the information bits part of the decoder input messages with the information bits and the parity bits part of the decoder input messages with erasures. Then the decoder can (always) recover the erased bits due to the lower triangular structure of the parity check matrix. If the parity checks are processed one after another by the decoder, then in each check only a single bit is unknown and the decoder sets this bit to be the XOR of the 6 (or 5) known bits in the check.

According to another embodiment, when using one or more of the abovementioned methods, decoding can be made more efficiently;

Since the block rows of the parity check matrices can be arranged in such a way that no two consecutive block rows have overlapping non-zero block entries, for example in the new matrix the rows can be sorted in the order 1, 13, 2, 14, 3, 15, . . . , 12, 24 to satisfy this property. The incentive is that when using a layered BP decoder, for example, in which block rows are updated serially one after another—when updating a block row, messages corresponding to the non-zero locations in the block row are read from memory into processing units, updated and written back to memory. This process requires several clocks to complete, thus a pipe may be used.

In this way each clock it is possible to process another block row. However once a message is read from the memory, till it is written back (while the message is in the processor pipe), it cannot be used again. Thus it should not appear in the consecutive block row that is processed, otherwise the pipe should be stalled and this would cause hardware inefficiency and reduce the maximal number of iterations that can be supported.

Thus, this invention offers a more efficient decoding solution, since it may better support pipeline implementation.

Figure 9:
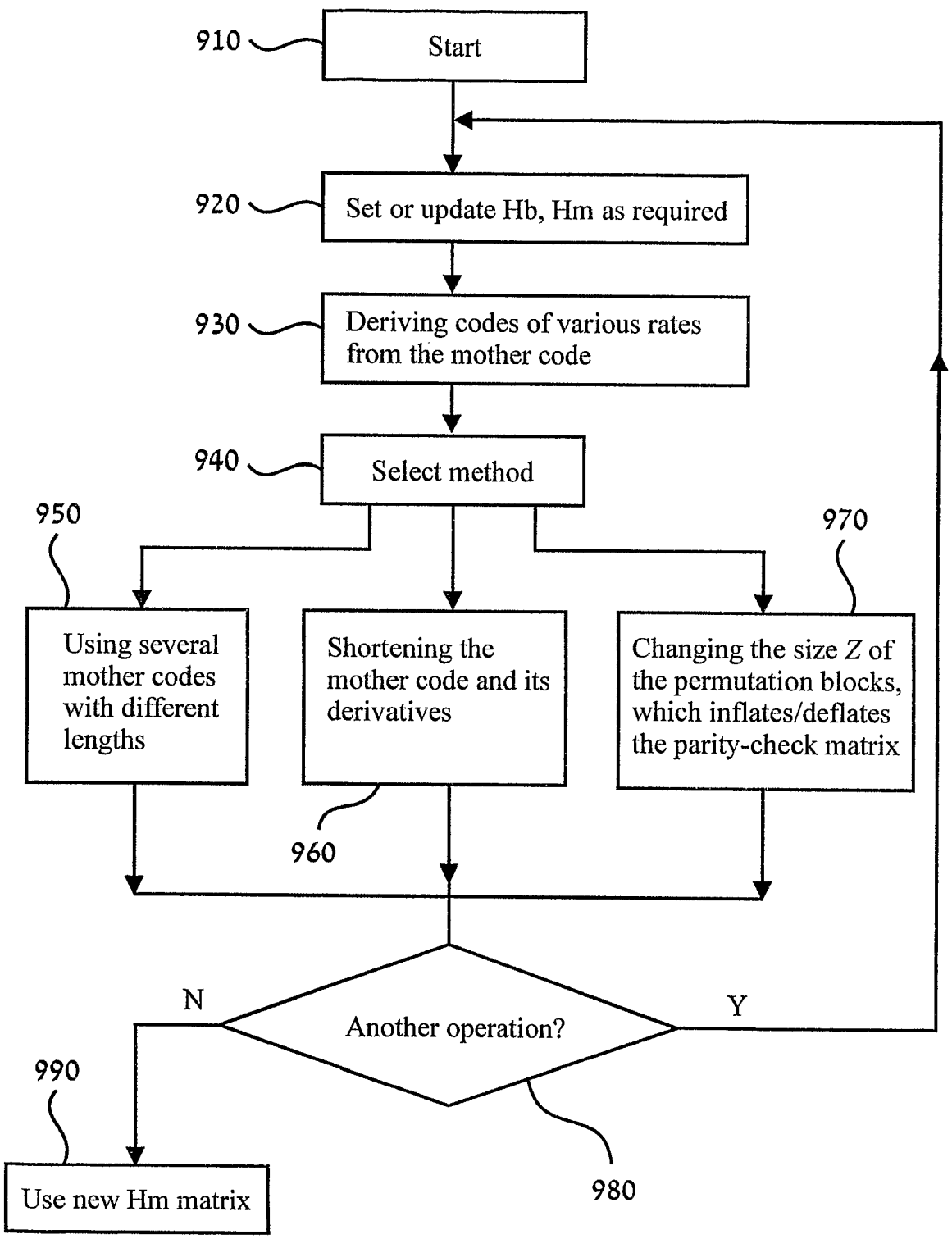
FIG. 9 illustrates a flow chart for creating parity check matrices of mother code Hm

FIG. 9 illustrates a flow chart for creating parity check matrices of mother code Hm, The method herein may be used after loading or setting Hb 910, or Hb may be set in any manner as already described, such as according the method 930 described in regards to FIG. 8, which described how to create Hm or H 930 out of Hb.

According to current method, various code lengths can be accommodated using any of the following methods, as required or defined for selecting the preferred method 940, can be performed:
  1. Shortening the mother code and its derivatives 960: shorter codes can be obtained by shortening each of the length $N_m$ codes of rates $\frac{1}{2}$ to $\frac{3}{4}$ that are obtained from the mother code. Any pair of code length $N_m$ and code rate $R_c$ maintaining $$\frac{N_m}{4} \leq N_c(1 - R_c) \leq \frac{N_m}{2}$$

can be obtained by shortening one of the length $N_m$ codes. Hence, larger flexibility in code length and rate is obtained compared to using a single rate mother code.
  2. Changing the size Z of the permutation blocks 970, which inflates/deflates the parity-check matrix.

Both of the methods described above can be used, however they suffer from the same disadvantage: the decoding time remains the same regardless of the code length. When shortening is used the decoder still works on the complete code even though the actual code length might be very small and the decoding time of short and long blocks is the same. When the permutation block size Z is used for changing the code length, the effect is the same. The block matrix structure allows to process Z rows or columns of the parity check matrix simultaneously using Z processors. When we "deflate" the permutation block size by factor α we obtain a shorter code of length $\alpha N_m$, but it also means that only $\alpha Z$ processors are active. Hence, the hardware is not used efficiently, and the decoding time of the length $\alpha N_m$ code remains the same as the decoding time of a length $N_m$ code.

According a preferred embodiment in this invention, novel matrices' dimensions are chosen, to better support OFDMA systems, which use LDPC. According to this embodiment, there are 48 carriers in each OFDMA sub-channel, modulation may include QPSK, 16 QAM or 64 QAM, each require 2, 4 or 6 bits, respectively. QPSK supports 48×2=96 bits, 16 QAM 48×4=192 bits, and 64QAM 48×6=288 bits.

It may be possible to select the preferred modulation method, and so in order to use available hardware resources efficiently the following unique value for n may be used:
576=(48×2)×6, for QPSK.
576=(48×4)×3, for 16 QAM.
576=(48×6)×2, for 64 QAM.

Thus according to this embodiment every value which is related to n, which is the length of the codeword, may have the length of 576 or its multiple. Preferred values for the width of Hb would include: 576, 1152, 1728, 2304, and so on.

In a novel embodiment, it is possible to use several mother codes 950, with different lengths. According to a preferred embodiment it is possible to use four mother codes of lengths $N_m$=2304, 1728, 1152, 576 with Z=12, Z=24 or other Z values. The code lengths are chosen as multiples of 48 bits to accommodate an integer number of OFDMA sub-channels. According to one embodiment, the permutation block size can be Z=12 for providing the possibility for sufficient parallelism to allow enough decoding iterations at high throughput and sever latency conditions as described.

All of the mother codes and the codes derived from them can be implemented on the same hardware. Adding each additional mother code may require only a ROM for maintaining its block parity check matrix Hb.

In one embodiment, the ROM size required for maintaining the matrix $H_b$ is $$\frac{7N_m}{2Z} \times \left( \left\lceil \log_2 \frac{N_m}{Z} \right\rceil + \lceil \log_2 Z \rceil \right)$$

bits. For the largest length 2304 code this amounts to 4032 bit ROM. For maintaining all 4 mother codes a 9744 bit ROM is needed. Thus, at a low cost of an increased ROM size we obtain full rate and code length flexibility.

The same encoder/decoder hardware supports lengths 2304, 1728, 1152 and 576 codes of any rate between ½ and ¾. Obtaining other code length between the 4 mother codes' lengths is done through the shortening mechanism.

The advantage of this method is that the decoding time is linear with the code length since all mother codes are constructed using 12×12 permutation blocks. This provides a good solution for both streaming applications and immediate ACK applications. In streaming applications, codes of different length perform the same number of iterations for a given throughput (while in the first two methods the performance of shorter codes would be severely impaired because they will be able to perform less decoding iterations). In immediate ACK applications shorter codes can be used when lower latency is needed.

It is possible to use Structured and/or Random code construction. Relevant code parameters and system parameters include:

N—code length
R—code rate
M=N(1−R)—number of rows in the parity-check matrix
$d_c$—average parity-check matrix row weight
I—desired maximal number of iterations (assuming no statistical multiplexing is used)
f—system clock
Z—decoder parallelism (number of processors)
L—decoding latency The standard decoding algorithms for LDPC codes are based on iterative message-passing algorithms. These algorithms rely on a graph-based representation of codes, where the decoding can be understood as message passing between nodes in a bipartite graph. In each iteration, messages are passed on all edges of the graph in both directions. The number of edges in the graph is equal to the number of 1's in the code's parity-check matrix, which is $M \times d_c$. Hence, a decoding iteration involves reading $M \times d_c$ messages from a memory, processing the messages and writing the updated messages back to memory. Assuming required decoding latency L, a system clock frequency f and a desired maximal number of iterations I, a decoding iteration should be performed in $$\frac{fL}{I}$$

clocks. This means that in each clock $$\frac{Md_c I}{fL}$$

messages should be read (and written) to the memory. One can then immediately see that many messages should be read each clock from the memory. This implies that using a randomly constructed LDPC code would require saving the messages in registers (since $$\frac{Md_c I}{fL}\text{-port RAM}$$

do not exist) leading to increased chip area. Furthermore, it would lead to severe routing problems of messages into processors, rendering the design impractical.

Using a structured block LDPC code can solve these problems, enabling simple simultaneous processing of sets of Z messages, by facilitating both their memory management and their routing from the memory to the processing units.

It is possible to repeat the process 980, thus using any combination of methods 920, 930, 950, 960 and 970 and to end it when required 990.

Simulation results for several methods, which include comparisons to other codes and explanations are detailed in: Provisional 1: "6. Simulation results" and Provisional 2: "7. Simulation results".

Industrial Applicability

The present invention refers to improvements in wireless communications. It describes a construction of a structured Multi-Rate Low-Density Parity-Check (MR-LDPC) code for OFDMA PHY. A basic mother code is used for deriving various code rates by merging parity checks of the mother code. The mother code is constructed using a block parity-check matrix with cyclic permutation blocks.

All codes derived from the mother code can be implemented on the same hardware of the mother code without additional cost.

Since the basic code is structured, the implementation complexity is low. The codes' parity check matrices have a lower triangular parity-bits section, enabling efficient linear encoding. The new invention includes flexible matrix's support rates, from ½ to ¾, for both large and small block size.

The invention claimed is:

1. A communications system which uses LDPC and comprises permutation matrices P of size Z×Z comprising a plurality of matrices P(0) . . . P(Z−1) and a stairs matrix P(st), from which a block parity check matrix $H_b$ is constructed, using only the permutation matrices P:P(0) . . . P(Z−1), the stairs matrix P(st) and a zero matrix 0, wherein the initial dimensions of $H_b$ are: 0.5 Nm×Nm or 0.5 n×n, wherein n is an integer representing a codeword vector length, wherein the height of the block parity check matrix $H_b$ is half of its width and wherein the initial code rate represented by the block parity check matrix $H_b$ is: R=(n−k)/n=0.5, wherein the initial $H_b$ is as shown with regards to FIG. 7.

2. A communications system which uses LDPC and comprises permutation matrices P of size Z×Z comprising a plurality of matrices P(0) . . . P(Z−1) and a stairs matrix P(st), from which a block parity check matrix $H_b$ is constructed, using only the permutation matrices P: P(0) . . . P(Z−1), the stairs matrix P(st) and a zero matrix 0, wherein the initial dimensions of $H_b$ are: 0.5 Nm×Nm or 0.5 n×n, wherein n is an integer representing a codeword vector length, wherein the height of the block parity check matrix $H_b$ is half of its width and wherein the initial code rate represented by the block parity check matrix $H_b$ is: R=(n−k)/n=0.5, wherein the initial dimensions of the block parity check matrix $H_b$ are referenced by the Z×Z matrices, and denoted by $M_b \times N_b$, and is such to satisfy the following:
  a. The $M_b \times M_b$ right side of the matrix is lower triangular;
  b. The lower rightmost block of the matrix is P(st)=$P^{st}$;
  c. Each row in the block matrix contains 6 or 7 non-zero block entries belonging to different sets of columns;
  d. $H_b$ is an irregular matrix, such that the block columns weights spectrum is optimized for providing good code performance in a small number of decoding iterations (ablock column's weidght is the number of non-zero block entries in a column);
  e. Rows j and j+Mb/2 for j=1 . . . Mb/2 have non-overlapping non-zero block entries;

wherein a method for deriving a plurality of codes of various rates from a mother code is implemented by summing up pairs of rows of the block matrix $H_b$ creating an H or Hm matrix, as follows:

1. Decide the required code rate:

$$R = \frac{1}{2} + \frac{\alpha}{N_b}$$

for any $$\alpha \in \left\{0, \ldots, \frac{N_b}{4}\right\};$$

2. Repeat summing up the rows j and $$j + \frac{M_b}{2}$$

for $j = 1, \ldots, \alpha$;

3. The resulting block matrix after summation is a $(M_b \alpha) \times N_b$, hence the code rate is $$1 - \frac{M_b - \alpha}{N_b} = \frac{1}{2} + \frac{\alpha}{N_b};$$

wherein the constructed mother code or the resulting matrix after summation remains a block matrix with permutation blocks as its entries and wherein said plurality of derived codes are of length $N_m$ with the same number of 1's in their parity-check matrix.

3. The communications system of claim 2, wherein encoding is done using the decoder by initializing the information bits part of the decoder input messages with the information bits and the parity bits part of the decoder input messages with erasures; the decoder is capable of recovering the erased bits due to the lower triangular structure of the parity check matrix.

4. The communications system of claim 3, wherein parity checks are processed one after another by the decoder, thus in each check only a single bit is unknown and the decoder sets this bit to be the XOR of the 6 (or 5) known bits in the check.

5. The communications system of claim 2, wherein decoding is done more efficiently, since the block rows of the parity check matrices are arranged in such a way that no two consecutive block rows have overlapping non-zero block entries (requirement e in claim 2 then when using a layered BP or equivalent decoder, in which block rows are updated serially one after another;

and since when updating a block row messages corresponding to the non-zero locations in the block row are read from memory into processing units means updated and written back to memory; and since this process requires several clocks to complete, and is preferably implemented using pipe means;

then it is possible in each clock to process another block row; thus a message is read from the memory and is written back (while the message is in the processor pipe), even though it cannot be used again; thus since it does not appear in the consecutive block row that is processed, the pipe is not stalled and the hardware is more efficient, reducing the maximal number of iterations.

6. A communications system which uses LDPC and comprises permutation matrices P of size Z×Z comprising a plurality of matrices P(0) ... P(Z−1) and a stairs matrix P(st), from which a block parity check matrix $H_b$ is constructed, using only the permutation matrices P: P(0) ... P(Z−1), the stairs matrix P(st) and a zero matrix 0, wherein the initial dimensions of $H_b$ are: 0.5 Nm×Nm or 0.5 n×n, wherein n is an integer representing a codeword vector length, wherein the height of the block parity check matrix $H_b$ is half of its width and wherein the initial code rate represented by the block parity check matrix $H_b$ is: R=(n−k)/n=0.5, wherein the initial dimensions of the block parity check matrix $H_b$ are referenced by the Z×Z matrices, and denoted by $M_b \times N_b$, and is such to satisfy the following:

a. The $M_b \times M_b$ right side of the matrix is lower triangular;
b. The lower rightmost block of the matrix is P(st)=$P^{st}$;
c. Each row in the block matrix contains 6 or 7 non-zero block entries belonging to different sets of columns;
d. $H_b$ is an irregular matrix, such that the block columns weights spectrum is optimized for providing good code performance in a small number of decoding iterations (ablock column's weidght is the number of non-zero block entries in a column);
e. Rows j and j+Mb/2 for j=1 ... Mb/2 have non-overlapping non-zero block entries;

wherein four mother codes of lengths $N_m$=2304, 1728, 1152, 576 are used, with Z=12, Z=24 or other Z multiples of 48 bits to accommodate an integer number of OFDMA sub-channels.

7. The communications system of claim 6, wherein Z=12, allowing using the same hardware for different codes; adding each additional mother code requires only a ROM or equivalent means for maintaining its block parity check matrix $H_b$.

8. The communications system of claim 7, wherein the size of memory means required for maintaining the matrix $H_b$ is $$\frac{7N_m}{2Z} \times \left(\left\lceil \log_2 \frac{N_m}{Z} \right\rceil + \lceil \log_2 Z \rceil \right)$$

bits; for code length 2304 this amounts to 4032 bits; for maintaining all four mother codes a 9744 bits memory is needed, thus at a low cost a full rate code length flexibility is obtained.

9. The communications system of claim 8, wherein one or more ROMs are used as memory means.

* * * * *